(12) United States Patent
Sun et al.

(10) Patent No.: US 12,225,706 B2
(45) Date of Patent: Feb. 11, 2025

(54) SEMICONDUCTOR DEVICE WITH PASSIVATED CONTACT PLUGS, SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Zhengqing Sun, Hefei (CN); Xing Jin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 770 days.

(21) Appl. No.: 17/447,218

(22) Filed: Sep. 9, 2021

(65) Prior Publication Data

US 2022/0093604 A1 Mar. 24, 2022

Related U.S. Application Data

(63) Continuation of application No. PCT/CN2021/105525, filed on Jul. 9, 2021.

(30) Foreign Application Priority Data

Sep. 21, 2020 (CN) .......................... 202010993937.9

(51) Int. Cl.
*H10B 12/00* (2023.01)
*H01L 21/66* (2006.01)
*H01L 23/31* (2006.01)

(52) U.S. Cl.
CPC ......... *H10B 12/01* (2023.02); *H01L 23/3192* (2013.01)

(58) Field of Classification Search
CPC .. H10B 12/01; H10B 12/0335; H10B 12/315; H10B 12/03; H01L 23/3192; H01L 22/14; H01L 21/76897; H01L 23/5226; H01L 23/5283

See application file for complete search history.

(56) References Cited

U.S. PATENT DOCUMENTS

| 6,246,085 | B1 | 6/2001 | Yoshida |
| 6,287,971 | B1 | 9/2001 | Park |
| 9,685,608 | B2 | 6/2017 | Maxwell et al. |
| 10,910,561 | B1 | 2/2021 | Maxwell et al. |
| 2014/0192589 | A1 | 7/2014 | Maxwell et al. |

(Continued)

FOREIGN PATENT DOCUMENTS

| CN | 104051277 A | 9/2014 |
| JP | H06120447 A | 4/1994 |

*Primary Examiner* — John P. Dulka
(74) *Attorney, Agent, or Firm* — Syncoda LLC; Feng Ma (57) ABSTRACT

A semiconductor structure manufacturing method includes: providing a substrate; forming a first insulating layer covering the substrate, and patterning the first insulating layer to form a plurality of vias and a plurality of isolation structures that are alternatingly distributed; forming conductive contact plugs in the vias respectively, where the conductive contact plugs cover bottoms of the vias and each includes a first region and a second region adjacent to each other, and the conductive contact plugs located in the first regions cover outer walls of the isolation structures and extend along the outer walls to surfaces of the isolation structures distal from the substrate; and forming a passivation layer covering side walls and surfaces of the conductive contact plugs.

16 Claims, 8 Drawing Sheets

(56) References Cited

U.S. PATENT DOCUMENTS

| | | | |
|---|---|---|---|
| 2016/0027896 A1* | 1/2016 | Lee | H01L 21/76879 |
| | | | 438/653 |
| 2020/0194302 A1* | 6/2020 | Ahn | H10B 12/0335 |
| 2020/0365537 A1* | 11/2020 | Choi | H10B 12/053 |

* cited by examiner

SEMICONDUCTOR DEVICE WITH PASSIVATED CONTACT PLUGS, SEMICONDUCTOR STRUCTURE AND MANUFACTURING METHOD THEREOF

CROSS-REFERENCE TO RELATED APPLICATIONS

This is a continuation of International Patent Application No. PCT/CN2021/105525 filed on Jul. 9, 2021, which claims priority to Chinese Patent Application No. 202010993937.9 filed on Sep. 21, 2020. The disclosures of these applications are hereby incorporated by reference in their entirety.

BACKGROUND

Dynamic Random-Access Memory (DRAM) is widely used in mobile devices such as mobile phones and tablet computers because of its advantages such as small size, high degree of integration, and fast transmission speed. As a core component of the DRAM, a capacitor is mainly configured to store charges.

It should be noted that the information disclosed in the background above is used only to enhance the understanding of the background of the disclosure, and therefore may include information that does not constitute the prior art known to those of ordinary skill in the art.

SUMMARY

The disclosure relates to the technical field of semiconductors, and in particular to a semiconductor device, a semiconductor structure and a manufacturing method therefor.

According to one aspect of the disclosure, a method for manufacturing a semiconductor structure is provided, including:
providing a substrate;
forming a first insulating layer covering the substrate, and patterning the first insulating layer to form a plurality of vias and a plurality of isolation structures that are alternatingly distributed;
forming conductive contact plugs in the vias respectively, where the conductive contact plugs cover bottoms of the vias and each includes a first region and a second region adjacent to each other, and the conductive contact plugs located in the first regions cover outer walls of the isolation structures and extend along the outer walls to surfaces of the isolation structures distal from the substrate; and
forming a passivation layer covering side walls and surfaces of the conductive contact plugs.

According to one aspect of the disclosure, a semiconductor structure is provided, including:
a substrate;
a first insulating layer covering the substrate, and including a plurality of vias and a plurality of isolation structures that are alternatingly distributed;
a plurality of conductive contact plugs respectively covering bottoms of the vias, where the conductive contact plugs each includes a first region and a second region adjacent to each other, and the conductive contact plugs located in the first regions cover outer walls of the isolation structures and extend along the outer walls to surfaces of the isolation structures distal from the substrate; and
a passivation layer covering side walls and surfaces of the conductive contact plugs.

According to one aspect of the disclosure, a semiconductor device is provided, including: the semiconductor structure according to any one of the foregoing items; and
a capacitor array including a plurality of columnar capacitors arranged at intervals, where the columnar capacitors are respectively formed on the conductive contact plugs, and lower electrode layers of the columnar capacitors are in contact with the conductive contact plugs.

It should be understood that both the foregoing general description and the following detailed description are exemplary and explanatory only, and are not restrictive of the disclosure.

BRIEF DESCRIPTION OF THE DRAWINGS

The accompanying drawings, which are incorporated in and constitute a part of the specification, illustrate embodiments in line with the disclosure and, together with the specification, serve to explain the principles of the disclosure. Apparently, the accompanying drawings in the following description show only some embodiments of the disclosure, and those of ordinary skill in the art may also obtain other accompanying drawings according to these accompanying drawings without creative efforts.

DETAILED DESCRIPTION

Exemplary embodiments will now be described more fully with reference to the accompanying drawings. However, the exemplary embodiments can be implemented in various forms and should not be understood as limited to the embodiments set forth herein. Conversely, these embodiments are provided to make the disclosure more comprehensive and complete, and to fully convey the concept of the exemplary embodiments to those skilled in the art. In the drawings, the same reference numerals represent the same or similar structures, and thus the detailed description will be omitted.

Although relative terms, such as "upper" and "lower", are used in the specification to describe the relative relationship of one component to another component, these terms are used herein for convenience only, for example, according to the direction of the examples as shown in the drawings. It can be understood that if the device in the drawings is turned upside down, the components described as "upper" will become the "lower" components. When one structure is "on" the other structure, it is possible to indicate that the structure is integrally formed on the other structure, or the structure is "directly" disposed on the other structure, or the structure is "indirectly" disposed on the other structure by means of another structure.

The terms "a", "an", "the", and "said" are used to express the presence of one or more elements/parts/or the like. The terms "include" and "have" are used to be inclusive, and mean there may be additional elements/parts/or the like in addition to the listed elements/parts/or the like. The terms "first" and "second" are only used as markers, not as a restriction on the number of objects.

A capacitor mainly includes a conductive contact plug and a storage capacitor connected to the surface of the conductive contact plug. After the conductive contact plug is formed, the DRAM conducts an electrical test thereon to verify the electrical performance of the conductive contact plug. During this process, an oxide layer is easily formed on the surface of the conductive contact plug, resulting in poor contact between the conductive contact plug and the storage capacitor.

Figure 1:
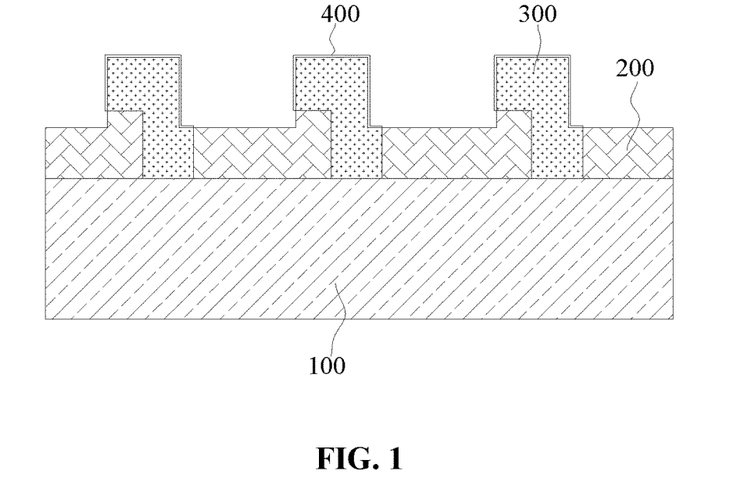
FIG. 1 is a schematic structural diagram of a semiconductor structure in some implementations.
Figure 2:
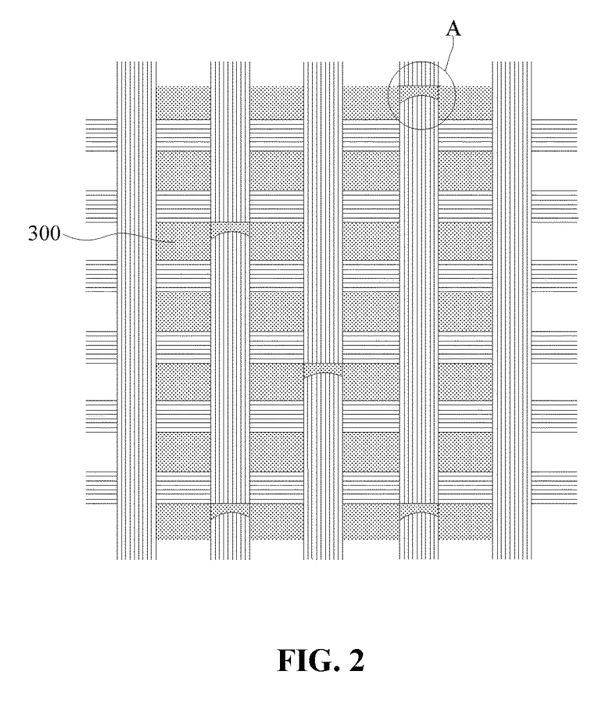
FIG. 2 is a schematic diagram of arrangement of conductive contact plugs in some implementations.

In some implementations, as shown in FIG. 1 and FIG. 2, a semiconductor structure mainly includes a substrate 100 as well as an insulating layer 200 and conductive contact plugs 300 formed on the substrate 100. In order to ensure the electrical performance of a Dynamic Random-Access Memory (DRAM), an electrical test needs to be conducted thereon during a manufacturing process. During this process, the conductive contact plugs 300 are exposed to the external environment, and surfaces thereof are likely to be oxidized to generate oxide crystal nuclei 400. Under high temperature conditions of the electrical test, the oxide crystal nuclei 400 further grow into an oxide crystal. The oxide crystal is not easy to be washed away by acid, resulting in poor contact between the conductive contact plugs 300 and a capacitor. Under high temperature conditions, thermal migration is likely to occur between two adjacent conductive contact plugs 300, such that the two adjacent conductive contact plugs 300 communicate with each other, and a short circuit is likely to occur between the two adjacent conductive contact plugs 300 (region A as shown in FIG. 2).

Figure 3:
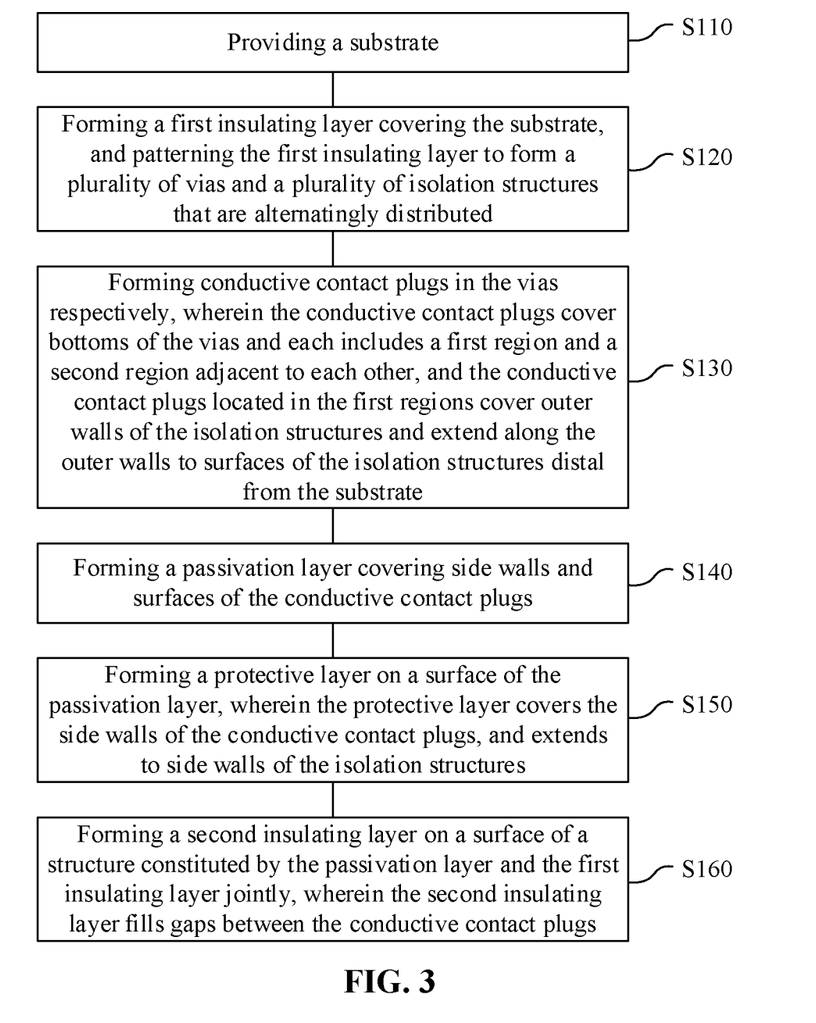
FIG. 3 is flowchart of a method for manufacturing a semiconductor structure according to an embodiment of the disclosure.

Embodiments of the disclosure provide a method for manufacturing a semiconductor structure. As shown in FIG. 3, the manufacturing method can include:

step S110: providing a substrate;

step S120: forming a first insulating layer covering the substrate, and patterning the first insulating layer to form a plurality of vias and a plurality of isolation grooves that are alternatingly distributed;

step S130: forming conductive contact plugs in the vias respectively, where the conductive contact plugs cover bottoms of the vias and each includes a first region and a second region adjacent to each other, and the conductive contact plugs located in the first regions cover outer walls of the isolation structures and extend along the outer walls to surfaces of the isolation structures distal from the substrate; and step S140: forming a passivation layer covering side walls and surfaces of the conductive contact plugs.

According to the method for manufacturing a semiconductor structure of the disclosure, charges in a storage capacitor can be stored through the conductive contact plugs. During this process, on the one hand, the conductive contact plugs can be supported by the top surfaces of the isolation structures to avoid the collapse of capacitor holes. On the other hand, the surfaces of the conductive contact plugs can be protected by the passivation layer to prevent the surfaces of the conductive contact plugs from being oxidized during an electrical test, and ensure that the conductive contact plugs maintain good contact with the storage capacitor, thereby improving the electrical performance of the semiconductor device. In addition, the passivation layer can form a barrier between two adjacent contact plugs, which can reduce the thermal migration effect of tungsten plugs in the subsequent heat treatment process, and reduce the risk of device failure. Furthermore, since the second regions of the conductive contact plugs are located in the bottoms of the vias, two adjacent vias are separated by an isolation structure, such that two adjacent conductive contact plugs are separated by the isolation structure, thus the communication between the two adjacent conductive contact plugs can be avoided, and the risk of a short circuit between the two adjacent conductive contact plugs can be reduced.

The following describes in detail the steps of the manufacturing method according to the embodiments of the disclosure.

In step S110, the substrate is provided.

The substrate can be of a flat structure, which can be a rectangle, a circle, an ellipse, a polygon or an irregular figure, and the material thereof can be silicon or other semiconductor materials. The shape and material of the substrate are not specifically limited here. It should be noted that the substrate of the disclosure can include semiconductor structures such as word lines and bit lines, which are not shown in the drawings because they do not involve the technical features of the disclosure.

In step S120, the first insulating layer covering the substrate is formed, and the first insulating layer is patterned to form the plurality of vias and the plurality of isolation structures that are alternatingly distributed.

Figure 4:
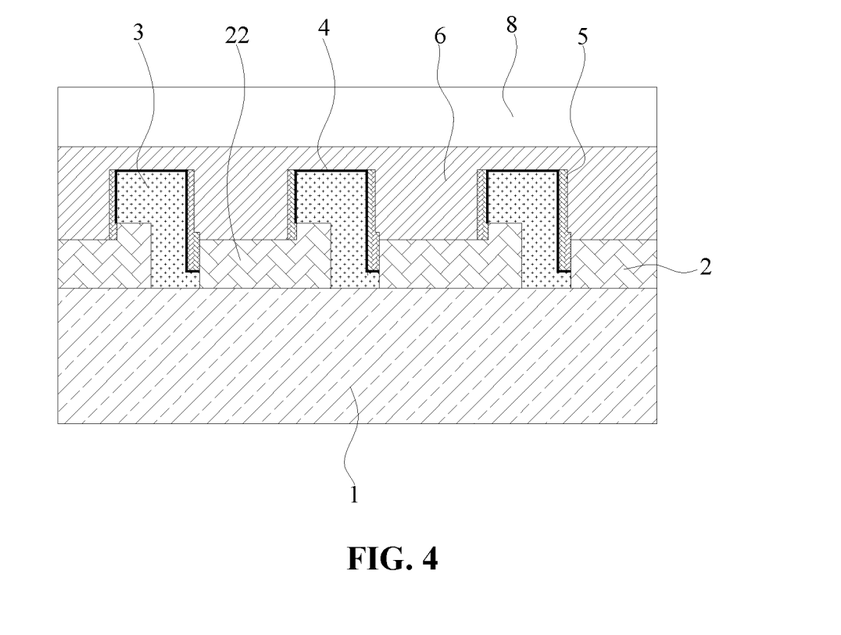
FIG. 4 is a schematic diagram of a semiconductor structure according to an embodiment of the disclosure.

As shown in FIG. 4, the first insulating layer 2 can be formed on the substrate 1. The first insulating layer 2 can be a thin film formed on a surface of the substrate 1. The first insulating layer 2 can be formed on the substrate 1 by means of chemical vapor deposition, atomic layer deposition or the like. Certainly, the first insulating layer 2 can also be formed by means of other methods, which will not be listed here. The first insulating layer 2 can have the same shape as the substrate 1, the material thereof can be silicon nitride, silicon oxide, etc., and the material is not specifically limited here.

Figure 5:
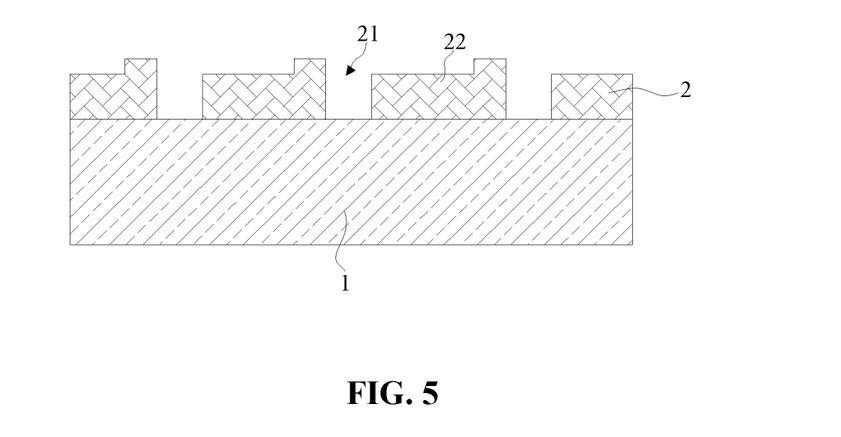
FIG. 5 is a schematic diagram of an isolation structure according to an embodiment of the disclosure.

The first insulating layer 2 can be patterned to form the plurality of vias 21 and the plurality of isolation structures 22 that are alternatingly distributed. As shown in FIG. 5, the isolation structure 22 can be groove-like structures. The vias 21 can be circular, rectangular, or in other shapes. The shapes of the vias 21 and the isolation structures 22 are not specifically limited here. Each via 21 and the isolation structure 22 adjacent thereto can form a group, and thus multiple groups of structures can be formed. The via 21 and the isolation structure 22 in each group can be arranged adjacent to each other, and a side wall of the via 21 proximal to the isolation structure 22 can be adjacent to the bottom of the isolation structure 22. Moreover, the bottom surface of the via 21 can be lower than the bottom surface of the isolation structure 22, such that the vias 21 are separated by the isolation structures 22 and the first insulating layer 2 located in the bottoms of the isolation structures 22. The isolation structures 22 and the vias 21 in two adjacent groups of structures can be separated by the top surfaces of the isolation structures 22, and the top surfaces of the isolation structures 22 can be configured to support the conductive contact plugs 3 to prevent the conductive contact plugs 3 from collapse.

The vias 21 and the isolation structures 22 can be formed on the first insulating layer 2 by means of a photolithography process. It is possible to form the vias 21 and the isolation structures 22 by photo-etching multiple times, that is, it is possible to form the vias 21 by first etching and then form the isolation structures 22 by second etching. Certainly, it is also possible to form the vias 21 and the isolation structures 22 simultaneously by one etching process. The formation process for the vias 21 and the isolation structures 22 is not specifically limited here.

In step S130, the conductive contact plugs are formed in the vias respectively. The conductive contact plugs cover bottoms of the vias and each includes a first region and a second region adjacent to each other, and the conductive contact plugs located in the first regions cover the outer walls of the isolation structures and extend along the outer walls to the surfaces of the isolation structures distal from the substrate.

Figure 6:
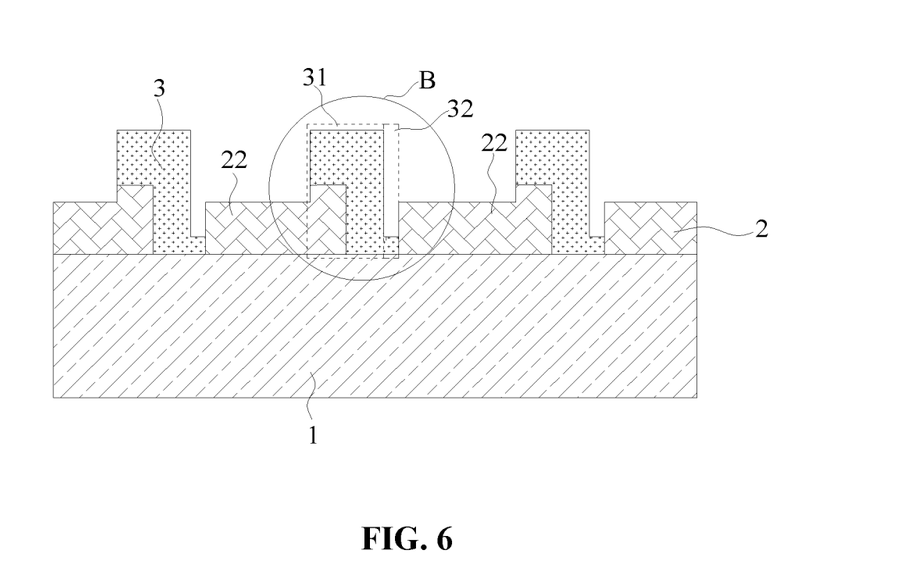
FIG. 6 is a schematic diagram of a conductive contact plug according to an embodiment of the disclosure.
Figure 7:
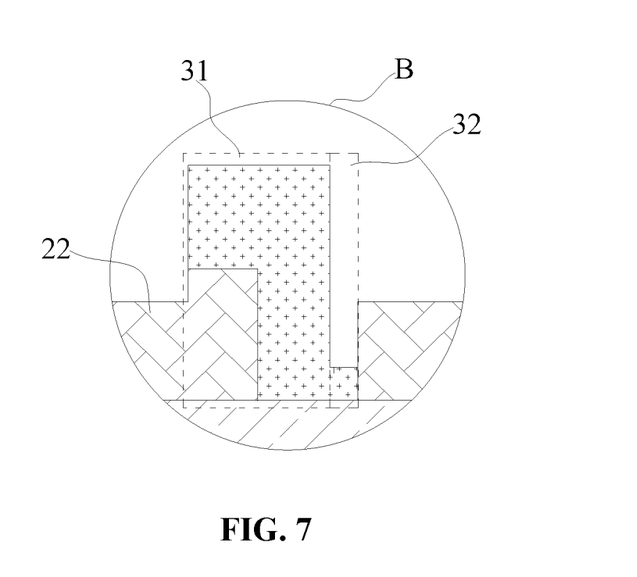
FIG. 7 is a partial enlarged view corresponding to a region B in FIG. 6.

As shown in FIG. 6, the conductive contact plugs 3 can be formed in the vias 21 respectively, such that the conductive contact plugs 3 are distributed at intervals. The conductive contact plug 3 can be in contact with the storage capacitor, and can store the charges in the storage capacitor. The conductive contact plugs 3 can cover the bottoms of the vias 21 and can be electrically connected to the substrate 1 through the vias 21 for signal transmission with the word lines and the bit lines in the substrate 1. As shown in FIG. 6 and FIG. 7, the conductive contact plugs 3 each can include a first region 31 and a second region 32 (region B as shown in the drawings) adjacent to each other. The conductive contact plugs 3 located in the first regions 31 can cover the outer walls of the isolation structures 22 and can extend along the outer walls to the surfaces of the isolation structures 22 distal from the substrate. The surfaces of the conductive contact plugs 3 located in the second regions 32 distal from the substrate 1 can be lower than the surface of the first insulating layer 2 distal from the substrate 1. That is, one end of the conductive contact plugs 3 can extend along the side walls of the vias 21 proximal to the top surfaces of the isolation structures 22 to the top surfaces of the isolation structures 22, and the surface of the other end distal from the substrate 1 can be lower than the surface of the first insulating layer 2 distal from the substrate 1. The contact area between the conductive contact plugs 3 and the insulating layer can be increased, and two adjacent conductive contact plugs 3 can also be separated by an isolation structure 22, thus the communication between the two adjacent conductive contact plugs 3 can be avoided, and the risk of a short circuit between two adjacent conductive contact plugs 3 can be reduced.

The conductive contact plugs 3 can be made of a conductive material, for example, the material can be tungsten, copper or polysilicon, etc., and certainly, can also be other conductive materials, which are not listed here. The conductive contact plugs 3 can be formed in the vias 21 by means of vacuum evaporation, magnetron sputtering, chemical vapor deposition, physical vapor deposition, or atomic layer deposition. Certainly, the conductive contact plugs 3 can also be formed by means of other method. The formation process for the conductive contact plugs 3 is not specifically limited here.

Figure 8:
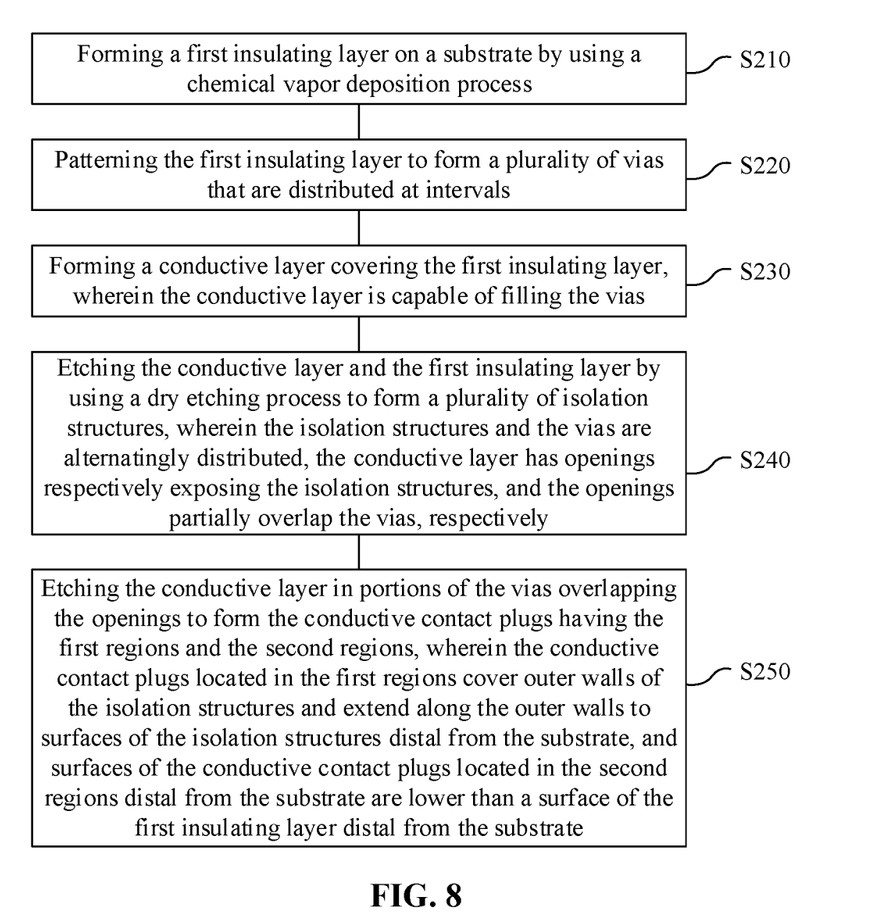
FIG. 8 is flowchart of a method for manufacturing a semiconductor device according to an embodiment of the disclosure.

In an embodiment of the disclosure, forming the isolation structures 22 and the conductive contact plugs 3 can include step S210 to step S250, as shown in FIG. 8.

At step S210, the first insulating layer is formed on the substrate by using a chemical vapor deposition process.

The first insulating layer 2 can be made of an insulating material to isolate the conductive contact plugs 3, the material thereof can be silicon nitride, silicon oxide, etc., and the material is not specifically limited here. The first insulating layer 2 can be a thin film formed on the substrate 1, and can completely cover the surface of the substrate 1. In an embodiment, the first insulating layer 2 can be formed on the substrate 1 by using a chemical vapor deposition process. Certainly, the first insulating layer 2 can also be formed by means of other methods, which are not specifically limited here.

At step S220, the first insulating layer is patterned to form the plurality of vias that are distributed at intervals.

The plurality of vias 21 that are distributed at intervals can be formed on the first insulating layer 2 by using a photolithography process. The vias 21 can respectively expose the substrate 1, such that other structures are connected to the substrate 1 through the vias 21.

For example, a mask material layer can be formed on the surface of the first insulating layer 2 distal from the substrate 1 by means of chemical vapor deposition, vacuum evaporation, atomic layer deposition or other methods, and a photoresist layer can be formed on the surface of the mask material layer distal from the substrate 1 by means of spin coating or other methods. The material of the photoresist layer can be positive photoresist or negative photoresist, which is not specifically limited here.

The photoresist layer can be exposed by using a mask, and the pattern of the mask can match the pattern required by the first insulating layer 2. Subsequently, the exposed photoresist layer can be developed to form a plurality of development regions. Each development region can expose the mask material layer, and the pattern of the development region can be the same as the pattern required by the first insulating layer 2. The width of the development region can be the same as the size required by the vias 21.

The mask material layer can be etched in the development region by means of a plasma etching process, and the first insulating layer 2 can be exposed in the etched region, so as to form a required mask pattern on the mask material layer. Moreover, the first insulating layer 2 is patterned according to the mask pattern to obtain each via 21. It should be noted that after the above-mentioned etching process is completed, the photoresist layer and the mask material layer can be removed to expose the formed vias 21.

At step S230, a conductive layer covering the first insulating layer is formed. The conductive layer is capable of filling the vias.

Figure 9:
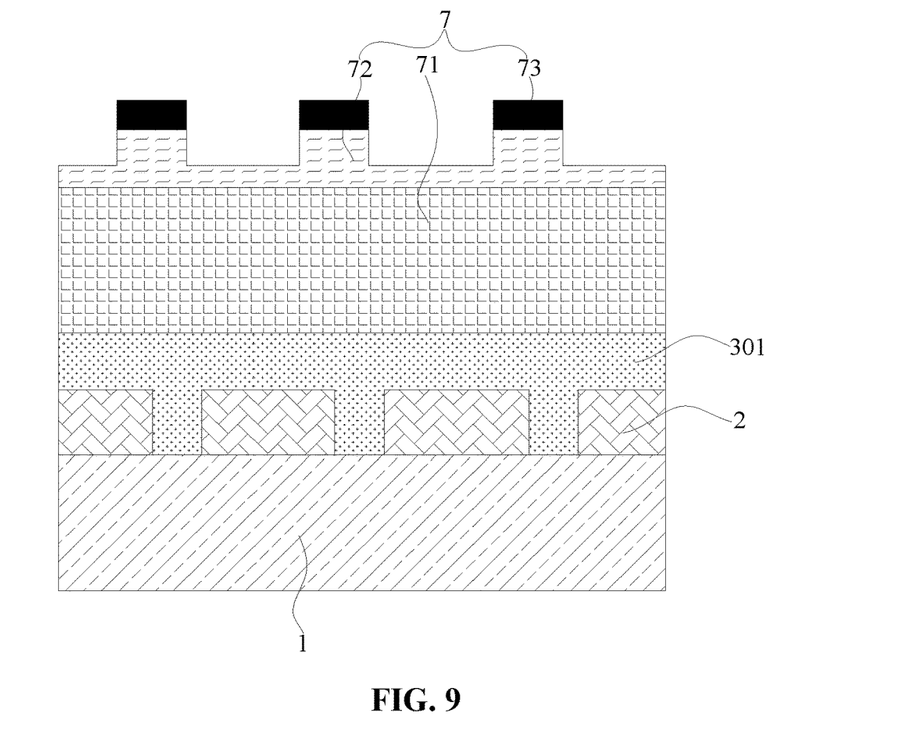
FIG. 9 is a schematic diagram of a mask layer according to an embodiment of the disclosure.

As shown in FIG. 9, the conductive layer 301 can be formed on the surface of the first insulating layer 2 distal from the substrate 1 by means of vacuum evaporation or chemical vapor deposition. During this process, the conductive layer 301 can fill the vias 21 in the first insulating layer 2. Moreover, the conductive layer can be in contact with the substrate 1 through the vias 21. The conductive layer 301 can be made of a conductive material, for example, the material thereof can be tungsten, copper or polysilicon, etc., and certainly, can also be other conductive materials, which are not specifically limited here.

At step S240, the conductive layer and the first insulating layer are etched by using a dry etching process to form the plurality of isolation structures. The isolation structures and the vias are alternatingly distributed. The conductive layer has openings respectively exposing the isolation structures, and the openings all partially overlap the vias, respectively.

Figure 10:
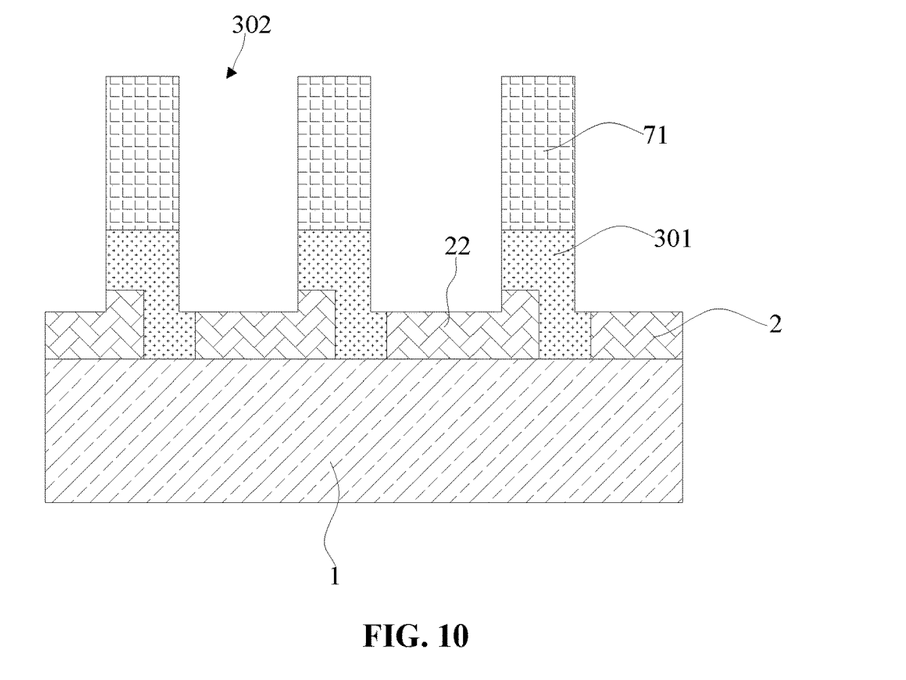
FIG. 10 is a schematic structural diagram corresponding to the completion of step S240 in FIG. 7.

As shown in FIG. 10, the conductive layer 301 and the first insulating layer 2 can be etched by using a dry etching process to form the openings 302 in the conductive layer 301, and also to form the plurality of isolation structures 22 in the first insulating layer 2. In an embodiment, the isolation structures 22 are all groove-shaped, and the isolation structures 22 can be alternatingly distributed with the vias 21 in the first insulating layer 2. The openings 302 can respectively expose the isolation structures 22. It should be noted that the number of the openings 302 can be equal to that of the vias 21 in the first insulating layer 2. The openings 302 can be arranged in a one-to-one correspondence with the vias 21. Moreover, partial regions of the openings 302 can respectively overlap partial regions of the corresponding vias 21, and the orthographic projections of the remaining partial regions on the isolation structures 22 adjacent to the vias 21 can overlap the boundaries of the isolation structures 22.

For example, a mask layer 7 can be formed on the side of the conductive layer 301 distal from the first insulating layer 2 by means of chemical vapor deposition or other methods. The material of the mask material layer can be at least one of silicon nitride, polysilicon, or carbon, and certainly, can also be other materials, which are not listed here. The mask material layer can be a single-layer structure or a multi-layer structure, which is not specifically limited here.

In an embodiment, as shown in FIG. 9, the mask layer 7 can be a multi-layer structure, which can include a carbon layer 71, a silicon nitride layer 72, and a polysilicon layer 73 stacked in sequence. The carbon layer 71 can formed on the surface of the conductive layer 301 distal from the first insulating layer 2. The silicon nitride layer 72 can be located between the carbon layer 71 and the polysilicon layer 73. The carbon layer 71 can be formed on the surface of the conductive layer 301 distal from the first insulating layer 2 by means of a chemical vapor deposition process. The silicon nitride layer 72 can be formed on the surface of the carbon layer 71 distal from the conductive layer 301 by means of an atomic layer deposition process. The polysilicon layer 73 can be formed on the surface of the silicon nitride layer 72 distal from the carbon layer 71 by means of a chemical vapor deposition process.

A photoresist layer can be formed on the surface of the mask layer 7 distal from the conductive layer 301 by means of spin coating or other methods. The material of the photoresist layer can be positive photoresist or negative photoresist, which is not specifically limited here.

The photoresist layer can be exposed by using a mask, and the pattern of the mask can match the pattern required by the openings 302 of the conductive layer 301. Subsequently, the exposed photoresist layer can be developed to form a plurality of development regions. Each development region can expose the mask layer 7, and the pattern of the development region can be the same as the pattern required by the conductive layer 301. The width of the development region can be the same as the size required by the openings 302.

The mask layer 7 can be etched in the development region by means of a plasma etching process, and the conductive layer 301 can be exposed in the etched region, so as to form a required mask pattern on the mask layer 7. It should be noted that when the mask layer 7 is a single-layer structure, the mask pattern can be formed by one etching process. When the mask layer 7 is a multi-layer structure, film layers can be etched in layers, that is, one layer can be etched by one etching process, and the mask layer 7 can be thoroughly etched by multiple etching processes to form the mask pattern.

It should be noted that after the above-mentioned etching process is completed, the photoresist layer can be removed by processes such as cleaning with a cleaning liquid or ashing, such that the mask layer 7 is no longer covered by the photoresist layer, and the formed mask layer 7 is exposed to obtain a hard mask structure, as shown in FIG. 10. The conductive layer 301 and the first insulating layer 2 can be plasma-etched according to the mask pattern to form the plurality of isolation structures 22 in the first insulating layer 2.

It should be noted that the conductive layer 301 and the first insulating layer 2 can be etched in stages, that is, the conductive layer 301 can be etched first to form the plurality of openings 302. The openings 302 can partially overlap the vias 21 in the first insulating layer 2 respectively and can expose the first insulating layer 2. Then, the first insulating layer 2 and the conductive layer 301 filling the vias 21 are synchronously etched at the openings 302 to form the isolation structures 22.

In step S250, the conductive layer in portions of the vias overlapping the openings is etched to form the conductive contact plugs having the first regions and the second regions. The conductive contact plugs located in the first regions cover the outer walls of the isolation structures and extend along the outer walls to the surfaces of the isolation structures distal from the substrate, and surfaces of the conductive contact plugs located in the second regions distal from the substrate are lower than a surface of the first insulating layer distal from the substrate.

The conductive layer 301 in the vias 21 overlapping the openings 302 can be selectively etched by using a first gas and a second gas by means of a plasma process, so as to form the conductive contact plugs 3 having the first regions 31 and the second regions 32. In an embodiment, the conductive contact plugs 3 located in the first regions 31 cover the outer walls of the isolation structures 22 and extend along the outer walls to the surfaces of the isolation structures 22 distal from the substrate 1, and the surfaces of the conductive contact plugs 3 located in the second regions 32 distal from the substrate 1 are lower than the surface of the first insulating layer 2 distal from the substrate 1. Thus, the communication between the conductive contact plugs 3 can be reduced. For example, the conductive contact plugs 3 can be in a deep Z shape.

In an embodiment, the first gas can be chlorine, and the second gas can be nitrogen trifluoride ($NF_3$) or hydrogen bromide (HBR). The etching ratio of the conductive contact plugs 3 to the first insulating layer 2 during the etching process can be controlled by separately controlling the flow of the first gas and the second gas. For example, the etching ratio of the conductive contact plugs 3 to the first insulating layer 2 is not less than 100:1.

It should be noted that the first gas and the second gas can also be other gases, as long as the conductive contact plugs 3 can be etched thereby without damaging other film layers. The gases are not specifically limited here.

In step S140, a passivation layer covering side walls and surfaces of the conductive contact plugs is formed.

Figure 11:
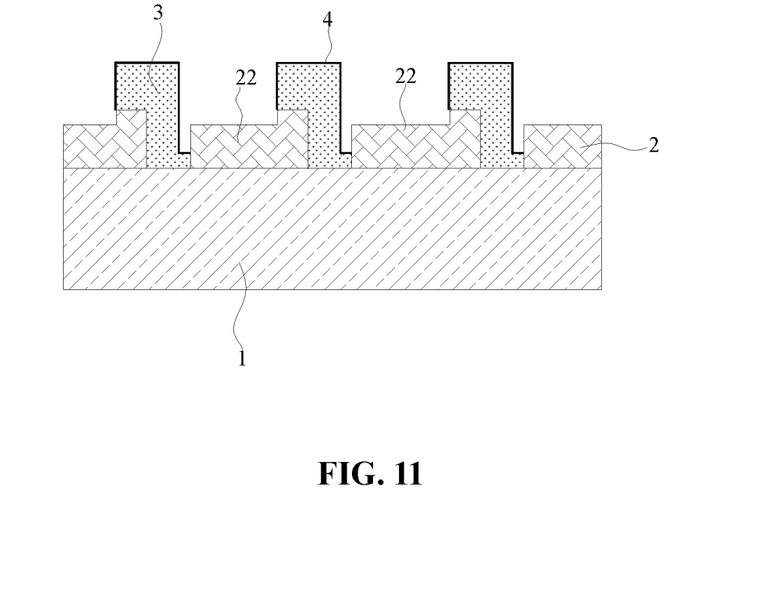
FIG. 11 is a schematic diagram of a passivation layer according to an embodiment of the disclosure.

As shown in FIG. 11, the passivation layer 4 can be formed on the side walls and the surface of the conductive contact plugs 3. The passivation layer 4 can block oxygen. The surfaces of the conductive contact plugs 3 can be protected by the passivation layer 4 to prevent the surfaces of the conductive contact plugs 3 from being oxidized due to excessive temperature during the electrical test, which affects the performance of the device.

The passivation layer 4 can be made of a conductive material, and the storage capacitor can be electrically connected to the conductive contact plugs 3 through the passivation layer 4. In an embodiment, the material of the passivation layer can be tungsten nitride. That is, the conductive contact plugs 3 can be tungsten plugs. The surfaces of the tungsten plugs can be treated by means of a hydrogen or nitrogen plasma treatment process to form the passivation layer 4 on the surfaces of the tungsten plugs. For example, by means of the hydrogen and nitrogen plasma treatment on the surfaces of the tungsten plugs, not only the tungsten oxide formed by oxidation on the surfaces of the tungsten plugs can be removed, but also tungsten nitride can be formed on the surfaces of the tungsten plugs while removing the tungsten oxide. The tungsten nitride can be used as the passivation layer 4 to protect the surfaces of the tungsten plugs and prevent the surfaces of the tungsten plugs from being further oxidized. In addition, the thermal migration effect of the tungsten plugs in the subsequent heat treatment process can be reduced, thereby reducing the risk of device failure. Furthermore, since tungsten nitride is a conductive material, the storage capacitor and the tungsten plugs can be electrically connected through the tungsten nitride to ensure the performance of the semiconductor device.

Certainly, the passivation layer 4 can also be formed on the side walls and surfaces of the conductive contact plugs 3 by means of vacuum evaporation, magnetron sputtering, chemical vapor deposition, physical vapor deposition or atomic layer deposition. The formation process for the passivation layer 4 is not specifically limited here.

The passivation layer 4 should not be too thick, so as not to affect the conductivity of the conductive contact plugs and thus affect the performance of the semiconductor structure, and the thickness thereof can range from 3 nm to 8 nm. For example, the thickness can be 3 nm, 4 nm, 5 nm, 6 nm, 7 nm, or 8 nm. Certainly, the passivation layer 4 can also have other thicknesses, which are not listed there.

In an embodiment of the disclosure, the manufacturing method of the disclosure can further include the following step.

At step S150, a protective layer is formed on a surface of the passivation layer. The protective layer covers the side walls of the conductive contact plugs, and extends to the side walls of the isolation structures for supporting the conductive contact plugs.

Figure 12:
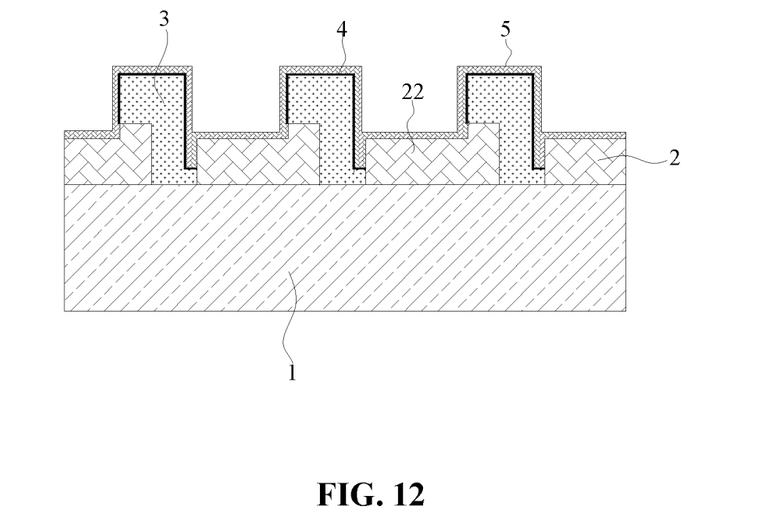
FIG. 12 is a schematic diagram of a protective layer according to an embodiment of the disclosure.

As shown in FIG. 12, the protective layer 5 can be formed on the surface of the passivation layer 4 by means of chemical vapor deposition or atomic layer deposition. The protective layer 5 can cover the side walls of the passivation layer 4 and can extend to the side walls of the isolation structures 22 for supporting the conductive contact plugs 3. In a subsequent pickling process, the protective layer 5 can protect the conductive contact plugs 3 and the surfaces of the isolation structures 22 for supporting the conductive contact plugs 3, to prevent the isolation structures 22 for supporting the conductive contact plugs 3 from being etched by acid, and avoid the collapse of the conductive contact plugs 3, thereby preventing the storage capacitor on the conductive contact plugs 3 from a short circuit due to collapse.

Figure 13:
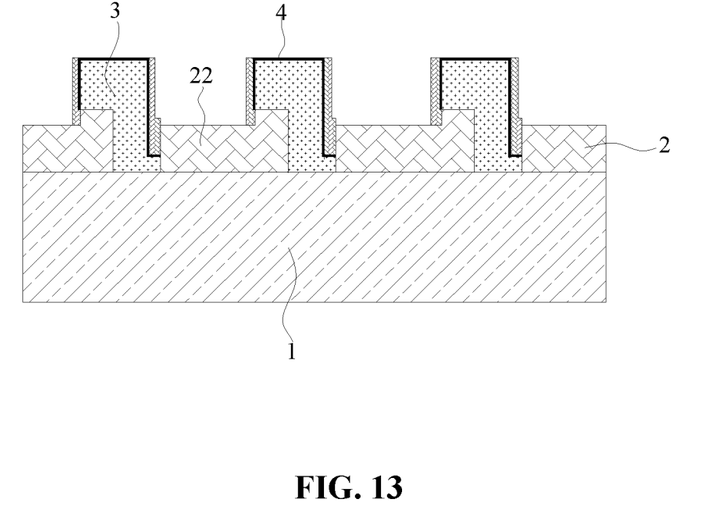
FIG. 13 is a schematic diagram of removing tops of conductive contact plugs and a protective layer located on a surface of a first insulating layer according to an embodiment of the disclosure.

For example, in order to facilitate the process, as shown in FIG. 12 and FIG. 13, the protective layer 5 can be formed on the passivation layer 4 and the surfaces of the isolation structures 22 for supporting the conductive contact plugs 3 by means of an atomic layer deposition process or chemical vapor deposition. The protective layer 5 on the tops of the conductive contact plugs 3 and on the surface of the first insulating layer 2 can be removed by means of a plasma dry etching process, and only the protective layer 5 located on the side walls of the conductive contact plugs 3 and the side walls of the isolation structures 22 for supporting the conductive contact plugs 3 is retained. This can ensure that subsequent electrical tests can be carried out smoothly, and can prevent the side walls of the isolation structures 22 from being etched by acid during the pickling process, which can cause the capacitor hole to collapse.

The protective layer 5 can be made of an insulating material, for example, the insulating material can be silicon dioxide, and the thickness thereof can range from 8 nm to 12 nm. For example, the thickness can be 8 nm, 9 nm, 10 nm, 11 nm, or 12 nm. Certainly, the protective layer 5 can also have other thicknesses, which are not listed there.

It should be noted that after the passivation layer 4 and the protective layer 5 are formed, an electrical performance test can be conducted on the conductive contact plugs 3 to test the electrical performance of the DRAM. During this process, the passivation layer 4 covers the outsides of the conductive contact plugs 3, and can prevent the surfaces of the conductive contact plugs 3 from being oxidized, thereby ensuring that the conductive contact plugs 3 maintain good contact with the storage capacitor, such that the electrical performance of the semiconductor device can be improved.

In an embodiment of the disclosure, the manufacturing method of the disclosure can further include the following step.

At step S160, a second insulating layer is formed on a surface of a structure constituted by the passivation layer and the first insulating layer jointly. The second insulating layer fills gaps between the conductive contact plugs.

After the electrical test is finished, as shown in FIG. 4, an insulating material can be deposited on the surface of the structure constituted by the passivation layer 4 and the first insulating layer 2 jointly by means of a chemical vapor deposition process to form the second insulating layer 6. The second insulating layer 6 can fill the gaps between the conductive contact plugs 3. That is, the second insulating layer 6 can fill the gap between two adjacent conductive contact plugs 3 and can be in contact with the first insulating layer 2. Furthermore, the second insulating layer 6 can also cover the surfaces of the conductive contact plugs 3. Two adjacent conductive contact plugs 3 can be separated by the first insulating layer 2 and the second insulating layer 6, so as to insulate the two adjacent conductive contact plugs 3. Since the passivation layer 4 and the protective layer 5 are provided on the surfaces of the conductive contact plugs 3, the both form a barrier between two adjacent conductive contact plugs 3, thereby reducing the thermal migration effect between the conductive contact plugs 3. Even if layer separation occurs between the first insulating layer 2 and the second insulating layer 6, the two conductive contact plugs 3 do not communicate with each other.

The manufacturing method according to the embodiments of the disclosure can further include forming an insulating dielectric layer 8. As shown in FIG. 4, the insulating dielectric layer 8 can be formed on the side of the second insulating layer 6 distal from the substrate 1. The storage capacitor can be formed in the insulating dielectric layer 8, and can pass through the second insulating layer 6 to communicate with the passivation layer 4 on the surfaces of the conductive contact plugs 3. The passivation layer 4 is made of a conductive material, and thus can electrically connect the storage capacitor to the conductive contact plugs 3, and then the charges collected in the storage capacitor can be stored through the conductive contact plugs 3.

The insulating dielectric layer 8 can be formed on the side of the second insulating layer 6 distal from the substrate 1 by means of atomic layer deposition or chemical vapor deposition. The insulating dielectric layer 8 can be a one-layer structure or a multi-layer structure, which is not specifically limited here. In an embodiment, the insulating dielectric layer 8 can include a film layer, which can be boron phosphorous silicate glass.

The embodiments of the disclosure also provide a semiconductor structure. As shown in FIG. 4, the semiconductor structure can include a substrate 1, a first insulating layer 2, a plurality of conductive contact plugs 3, and a passivation layer 4.

The first insulating layer 2 can cover the substrate 1, and can include a plurality of vias 21 and a plurality of isolation structures 22 that are alternatingly distributed.

The plurality of conductive contact plugs 3 can respectively cover the bottoms of the vias 21. The conductive contact plugs 3 each includes a first region 31 and a second region 32 adjacent to each other. The conductive contact plugs 3 located in the first regions 31 cover outer walls of the isolation structures 22 and extend along the outer walls to surfaces of the isolation structures 22 distal from the substrate 1.

The passivation layer 4 can cover side walls and surfaces of the conductive contact plugs 3.

According to the semiconductor structure of the disclosure, charges in a storage capacitor can be stored through the conductive contact plugs 3. During this process, on the one hand, the conductive contact plugs 3 can be supported by the top surfaces of the isolation structures 22 to avoid the collapse of capacitor holes. On the other hand, the surfaces of the conductive contact plugs 3 can be protected by the passivation layer 4 to prevent the surfaces of the conductive contact plugs 3 from being oxidized during an electrical test, and ensure that the conductive contact plugs 3 maintain good contact with the storage capacitor, thereby improving the electrical performance of the semiconductor device. In addition, the passivation layer 4 can form a barrier between two adjacent contact plugs, which can reduce the thermal migration effect of tungsten plugs in the subsequent heat treatment process, and reduce the risk of device failure. Furthermore, since the second regions 32 of the conductive contact plugs 3 are located in the bottoms of the vias 21, and two adjacent vias 21 are separated by an isolation structure 22, such that two adjacent conductive contact plugs 3 are separated by the isolation structure 22, thus the communication between two the adjacent conductive contact plugs 3 can be avoided, and the risk of a short circuit between the two adjacent conductive contact plugs 3 can be reduced.

Subsequently, the above-mentioned semiconductor structure can be etched by means of a plasma etching process to expose the conductive contact plugs 3, so as to facilitate the contact between the conductive contact plugs 3 and the storage capacitor. Since no inventive point is involved, no repeated description is provided here.

The specific details and manufacturing processes of all parts of the above-mentioned semiconductor structure have been described in detail in the corresponding method for manufacturing a semiconductor structure, and therefore, no repeated description is provided here.

The embodiments of the disclosure also provide a semiconductor device, including the semiconductor structure according to any one of the foregoing embodiments and a capacitor array. The capacitor array can include a plurality of columnar capacitors arranged at intervals. The columnar capacitors are respectively formed on the conductive contact plugs 3, and lower electrode layers of the columnar capacitors are in contact with the conductive contact plugs 3. When in use, the plurality of columnar capacitors can be charged and discharged simultaneously, thereby increasing the capacitance.

For example, the semiconductor device can be a storage chip, for example, a DRAM, and certainly, can also be other semiconductor devices, which are not listed here. The beneficial effects of the semiconductor device can be referred to the beneficial effects of the above-mentioned semiconductor structure, which are not repeated here.

Other embodiments of the disclosure will be apparent to those skilled in the art from consideration of the specification and practice of the invention disclosed here. This application is intended to cover any variations, uses, or adaptive changes of the disclosure following the general principles thereof and including such departures from the disclosure as come within known or customary practice in the art. It is intended that the specification and examples be considered as exemplary only, with a true scope and spirit of the disclosure being indicated by the appended claims.

What is claimed is:

1. A manufacturing method for a semiconductor structure, comprising:
   providing a substrate;
   forming a first insulating layer covering the substrate, and patterning the first insulating layer to form a plurality of vias and a plurality of isolation structures that are alternatingly distributed;
   forming conductive contact plugs in each of the vias respectively, wherein the conductive contact plugs cover bottoms of the vias and each comprises a first region and a second region adjacent to each other, and the conductive contact plugs located in the first regions cover outer walls of the isolation structures and extend along the outer walls to surfaces of the isolation structures distal from the substrate; and
   forming a conductive passivation layer covering side walls and upper surfaces of the conductive contact plugs;
   wherein a thickness of the conductive passivation layer ranges from 3 nm to 8 nm.

2. The manufacturing method of claim 1, wherein upper surfaces of the conductive contact plugs located in the second regions distal from the substrate are lower than an upper surface of the first insulating layer distal from the substrate.

3. The manufacturing method of claim 1, wherein the forming a conductive passivation layer covering side walls and upper surfaces of the conductive contact plugs comprises:
   forming the conductive passivation layer on the surfaces of the conductive contact plugs by using a plasma processing process.

4. The manufacturing method of claim 1, wherein said forming the isolation structures and the conductive contact plugs comprises:
   forming the first insulating layer on the substrate by using a chemical vapor deposition process;

patterning the first insulating layer to form the plurality of vias that are distributed at intervals;

forming a conductive layer covering the first insulating layer, wherein the conductive layer fills the vias;

etching the conductive layer and the first insulating layer by using a dry etching process to form the plurality of isolation structures, wherein each of the isolation structures and each of the vias are alternatingly distributed, the conductive layer has openings respectively exposing the isolation structures, and the openings partially overlap the vias, respectively; and etching the conductive layer in portions of the vias overlapping the openings to form the conductive contact plugs having the first regions and the second regions, wherein the conductive contact plugs located in the first regions cover the outer walls of the isolation structures and extend along the outer walls to the surfaces of the isolation structures distal from the substrate, and upper surfaces of the conductive contact plugs located in the second regions distal from the substrate are lower than an upper surface of the first insulating layer distal from the substrate.

5. The manufacturing method of claim 4, wherein said forming the plurality of isolation structures comprises:

forming a mask layer on a side of the conductive layer 301 distal from the first insulating layer;

etching the mask layer to form a mask pattern; and etching the conductive layer and the first insulating layer according to the mask pattern to form the plurality of isolation structures in the first insulating layer.

6. The manufacturing method of claim 1, wherein the manufacturing method further comprises:

forming a second insulating layer on a surface of a structure constituted by the conductive passivation layer and the first insulating layer jointly, wherein the second insulating layer fills gaps between the conductive contact plugs.

7. The manufacturing method of claim 6, further comprising:

forming an insulating dielectric layer on a side of the second insulating layer distal from the substrate.

8. The manufacturing method of claim 1, wherein each via and an isolation structure adjacent to the via form a group, in each group, a side wall of the via proximal to the isolation structure is adjacent to a bottom of the isolation structure, and a bottom surface of the via is lower than the bottom surface of the isolation structure.

9. The manufacturing method of claim 1, further comprising:

forming a protective layer on a surface of the conductive passivation layer, wherein the protective layer covers the side walls of the conductive contact plugs, and extends to the side walls of the isolation structures for supporting the conductive contact plugs.

10. A semiconductor structure, comprising:

a substrate;

a first insulating layer covering the substrate, and comprising a plurality of vias and a plurality of isolation structures that are alternatingly distributed;

a plurality of conductive contact plugs respectively covering bottoms of the vias, wherein the conductive contact plugs each comprises a first region and a second region adjacent to each other, and the conductive contact plugs located in the first regions cover outer walls of the isolation structures and extend along the outer walls to surfaces of the isolation structures distal from the substrate; and a conductive passivation layer covering side walls and upper surfaces of the conductive contact plugs;

wherein a thickness of the conductive passivation layer ranges from 3 am to 8 nm.

11. The semiconductor structure of claim 10, wherein upper surfaces of the conductive contact plugs located in the second regions distal from the substrate are lower than an upper surface of the first insulating layer distal from the substrate.

12. The semiconductor structure of claim 10, wherein the semiconductor structure further comprises:

a second insulating layer formed on a surface of a structure constituted by the conductive passivation layer and the first insulating layer jointly, wherein the second insulating layer fills gaps between the conductive contact plugs.

13. The semiconductor structure of claim 12, wherein the semiconductor structure further comprises:

an insulating dielectric layer formed on a side of the second insulating layer distal from the substrate.

14. The semiconductor structure of claim 10, wherein each via and an isolation structure adjacent to the via form a group, in each group, a side wall of the via proximal to the isolation structure is adjacent to a bottom of the isolation structure, and a bottom surface of the via is lower than the bottom surface of the isolation structure.

15. The semiconductor structure of claim 10, wherein the semiconductor structure further comprises:

a protective layer formed on a surface of the conductive passivation layer, wherein the protective layer covers the side walls of the conductive contact plugs, and extends to the side walls of the isolation structures for supporting the conductive contact plugs.

16. A semiconductor device, comprising:

a substrate;

a first insulating layer covering the substrate, and comprising a plurality of vias and a plurality of isolation structures that are alternatingly distributed;

a plurality of conductive contact plugs respectively covering bottoms of the vias, wherein the conductive contact plugs each comprises a first region and a second region adjacent to each other, and the conductive contact plugs located in the first regions cover outer walls of the isolation structures and extend along the outer walls to surfaces of the isolation structures distal from the substrate;

a conductive passivation layer covering side walls and upper surfaces of the conductive contact plugs, wherein a thickness of the conductive passivation layer ranges from 3 nm to 8 nm; and a capacitor array comprising a plurality of columnar capacitors arranged at intervals, wherein the plurality of columnar capacitors are respectively formed on the conductive contact plugs, and lower electrode layers of the columnar capacitors are in contact with the conductive contact plugs.

* * * * *